(12) United States Patent
Chung et al.

(10) Patent No.: US 6,283,134 B1
(45) Date of Patent: Sep. 4, 2001

(54) APPARATUS FOR REMOVING PHOTO-RESIST

(75) Inventors: Army Chung, Hsinchu; Hsi-Hsin Hong, Nantou Hsien; Chi-Fa Ku, Kaohsiung Hsien, all of (TW)

(73) Assignee: United Microelectronics Corp., Taiwan (CN)

( * ) Notice: Subject to any disclaimer, the term of this patent is extended or adjusted under 35 U.S.C. 154(b) by 0 days.

(21) Appl. No.: 09/010,683

(22) Filed: Jan. 22, 1998

(30) Foreign Application Priority Data

Dec. 24, 1997 (TW) .................................................. 86119669

(51) Int. Cl.$^7$ ........................................................ B08B 3/02
(52) U.S. Cl. ........................... 134/62; 134/105; 134/95.3; 134/901
(58) Field of Search ................................ 134/61, 62, 105, 134/111, 902, 95.2, 95.3

(56) References Cited

U.S. PATENT DOCUMENTS

| 4,715,392 | * | 12/1987 | Abe et al. . | |
|---|---|---|---|---|
| 4,745,422 | * | 5/1988 | Matsukoa et al. . | |
| 4,850,381 | * | 7/1989 | Moe et al. . | |
| 5,177,514 | * | 1/1993 | Ushijima et al. . | |
| 5,361,449 | * | 11/1994 | Akimoto . | |
| 5,374,312 | * | 12/1994 | Hasebe et al. . | |
| 5,518,542 | * | 5/1996 | Matsukawa et al. | 15/77 |
| 5,853,961 | * | 12/1998 | Sakai et al. . | |
| 5,858,112 | * | 1/1999 | Yonemizu et al. . | |

\* cited by examiner

*Primary Examiner*—Frankie L. Stinson
(74) *Attorney, Agent, or Firm*—Rabin & Champagne, PC

(57) ABSTRACT

An apparatus for removing photo-resist. The apparatus comprises carriers for carrying a wafer, hot plates to remove residue solvent on the wafer, a cooling plate to decrease the wafer temperature, an reverse unit to turn over the wafer, a development unit to develop and remove photo-resist on the wafer, a top scrubbing unit to clean a top side of the wafer, and a back scrubbing unit to clean a back side of the wafer.

19 Claims, 2 Drawing Sheets

APPARATUS FOR REMOVING PHOTO-RESIST

CROSS-REFERENCE TO RELATED APPLICATION

This application claims the priority benefit of Taiwan application serial no. 86119669, filed Dec. 24, 1997, the full disclosure of which is incorporated herein by reference.

BACKGROUND OF THE INVENTION

1. Field of the Invention

The invention relates to an apparatus for removing photo-resist, and more particularly to a gradient elution method of removing photo-resist without moving to another region other than the current processing region.

2. Description of the Related Art

The process of fabricating an IC is very complex. Hundreds of steps are needed for making an IC. The fabrication normally takes one or two month to complete. The IC industry is a high technology industry including four main branches: IC design, wafer fabrication, wafer testing, and wafer packaging.

For example, the main purpose for the process of development is to clean the exposed part of photo-resist layer by chemical reaction, and to develop the transferred pattern.

There are many methods to perform a development process. For a commercial in-line operation, a "spray/puddle" method is normally adapted. The "spray/puddle" method comprises three steps. Firstly, a developer is sprayed onto a wafer deposed on a spinner. Secondly, the wafer is puddle developed in a stationary status. Thirdly, after cleaning by water, the wafer is spun dry.

The next step after development is, before performing photolithography, to perform a quality control step, that is, an "after inspection (ADI)" step. The ADI step is to ensure the accuracy after the subsequent photolithography process. Thus, any abnormal state or condition can be found and reworked before the whole wafer to be damaged in the subsequent process.

During photolithography, such as forming photo-resist, exposure, bake, or development, or before cured by ultraviolet and performing plasma bombardment, if a fault is found, photo-resist has to be removed and reworked to avoid a further damage. In the conventional semiconductor process, the region of removing photo-resist and the processing region of photolithography is separate. Therefore, if a fault is found during fabrication, the photo-resist has to be removed in region of removing photo-resist. The removal of photo-resist can not be performed in the processing region of photolithography, and thus, consumes a long fabricating time.

One of the conventional method to remove photo-resist is to use an organic solution. The bonding of the photo-resist is destroyed by and dissolved in the organic solution. Normally, groups of acetone and aromatic base are used as the organic solution for removing photo-resist. In addition, photo-resist is an organic compound composed of carbon and hydrogen element. Therefore, inorganic solution such as sulfuric acid ($H_2SO_4$) and perhydrol ($H_2O_2$), can be used to oxidise the carbon element into carbon dioxide ($CO_2$) by perhydrol and to remove the hydrogen element by dehydration of sulfuric acid. Another method to remove photo-resist is by plasma.

Though several methods are available to remove photo-resist in a conventional process, almost all the removal regions of photo-resist are separated from the processing region of photo-lithography. Therefore, during the process, the faulty wafers have to be moved from the current processing region to the removal region of photo-resist for rework.

SUMMARY OF THE INVENTION

It is therefore an object of the invention to provide an apparatus for removing photo-resist. The photo-resist is removed in the current processing region without being moved to another region.

It is therefore another object of the invention to provide an apparatus for removing photo-resist. Using acetone as medium, so that N-methyl-pyrrolidone (NMP) and deionized water are mutually dissolvable, and photo-resist on the wafer is removed by a gradient elution method.

To achieve these objects and advantages, and in accordance with the purpose of the invention, as embodied and broadly described herein, the invention is directed towards an apparatus for removing photo-resist. The apparatus comprises carriers for carrying a wafer, hot plates to remove residue solvent on the wafer, a cooling plate to decrease the wafer temperature, an reverse unit to turn over the wafer, a development unit to develop and remove photo-resist on the wafer, a top scrubbing unit to clean a top side of the wafer, and a back scrubbing unit to clean a back side of the wafer.

It is to be understood that both the foregoing general description and the following detailed description are exemplary and explanatory only and are not restrictive of the invention, as claimed.

DESCRIPTION OF THE PREFERRED EMBODIMENTS

Figure 1:
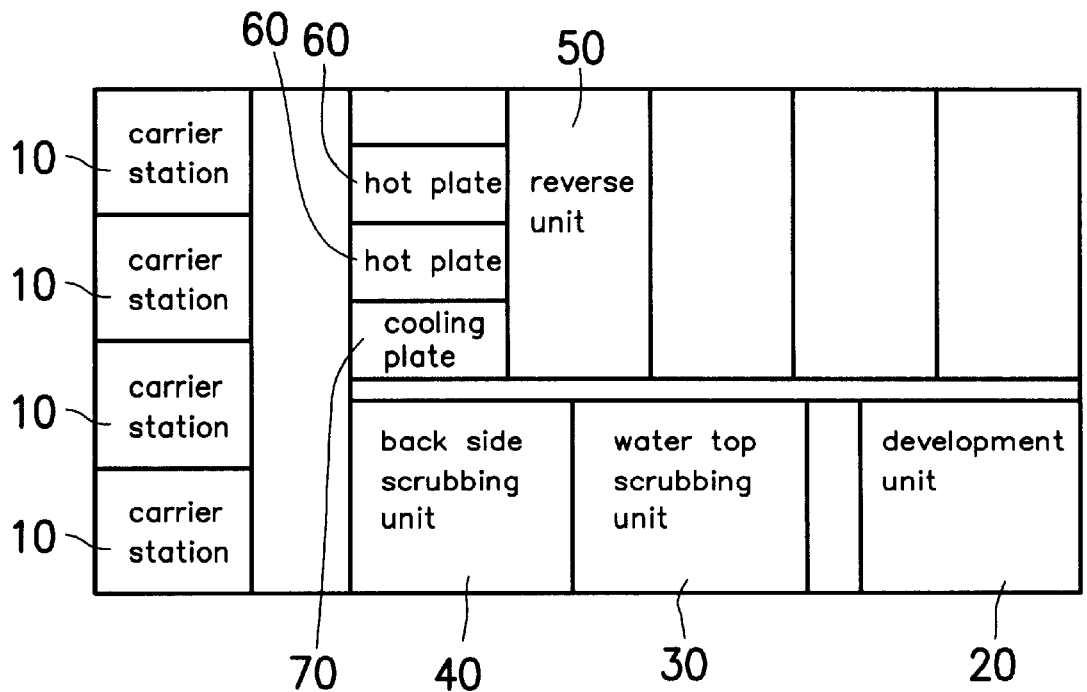
FIG. 1 shows a configuration of an apparatus for removing photo-resist in a preferred embodiment according to the invention.

Referring to FIG. 1, an apparatus for removing photo-resist in a preferred embodiment according to the invention is shown. The apparatus for removing photoresist comprises four carrier stations 10 for wafer carrying, a development unit 20 to develop or remove photo-resist on the wafer, a top scrubbing unit 30 to clean the top side of the wafer, a reverse unit 50 to turn over the wafer for cleaning the opposite side, a back scrubbing unit 40 to clean the back side of the wafer, two hot plate to remove the residue solvent on the wafer, and a cooling plate to cool down the temperature of the wafer.

Figure 2:
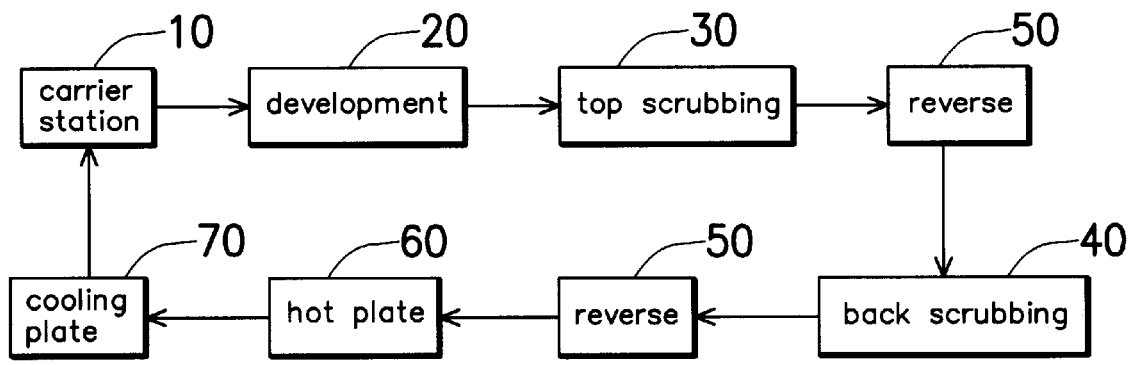
FIG. 2 is a flow chart of for removing photo-resist using the apparatus shown on FIG. 1.

Referring FIG. 1 and FIG. 2, an apparatus, and by which the operation flow of removing photo-resist are shown. A wafer is deposed on one of the carriers 10. The wafer is then delivered to the development unit 20. After development and removal of photo-resist, the wafer is delivered to the top scrubbing unit 30 for top side scrubbing and cleaning. Through the reverse unit 50, the wafer is turned over for the preparation of back side scrubbing and cleaning. The wafer is delivered to the back scrubbing unit 40 for back side cleaning. After the cleaning steps, the wafer is delivered on one of the hot plates 60 to remove the residue solvent on the wafer, and then to a cooling plate 70 to decrease the temperature of the wafer. The wafer is then delivered back to the carrier 10.

Figure 3:
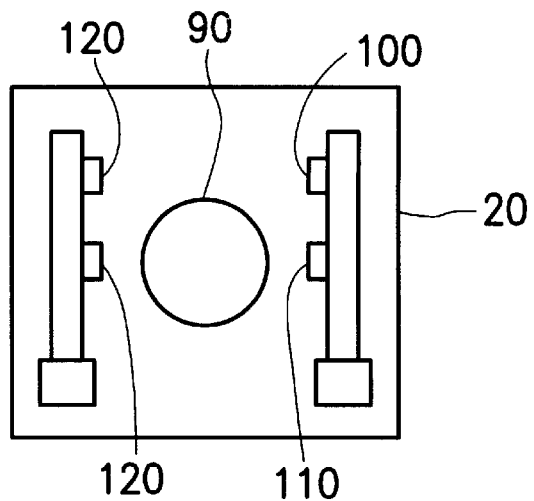
FIG. 3 shows the configuration of the development unit in the apparatus shown on FIG. 1.

Referring to FIG. 3, a detailed configuration of development unit 20 in the above apparatus is shown. The development unit 20 comprises a wafer processing region 90 as a region for wafer spray/puddle, a first nozzle 100 to spray thinner, a (backup) second nozzle 110 to spray developer, and a third nozzle 120 to spray acetone.

The thinner mentioned above is NMP, or material with less polarity, for example, pyrrolidone, pyrridin, or aromatic organic solvent. Organic solvent such as ketone or alcohol solvent with higher polarity can be used instead of acetone. By acetone spray, NMP is dissolvable in deionized water, and therefore, the residue solvent on the wafer can be removed.

Figure 4:
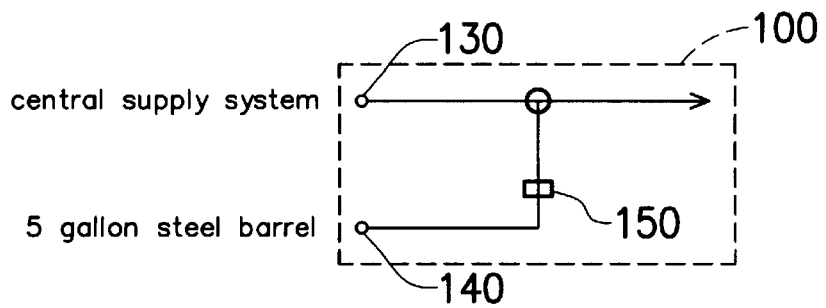
FIG. 4 shows the internal structure of a spray in the apparatus shown on FIG. 1.

Referring to FIG. 3 and FIG. 4, thinner sprayed from the first nozzle 100 is supplied by the central supply system 130 and a five gallon steel barrel 140. If thinner supplied by the central supply system 130 is all consumed, a switch 150 is open to continuously supply thinner from the steel barrel 140.

Figure 5:
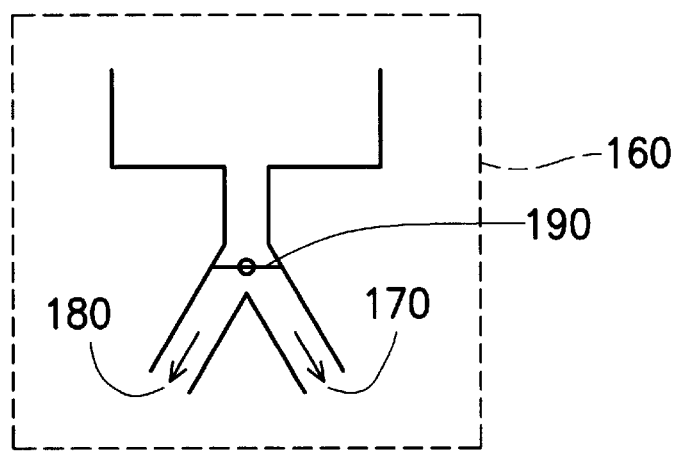
FIG. 5 shows the configuration of a recycling unit.

Referring to FIG. 3 and FIG. 5, after the wafer is processed in the wafer processing region 90, solvent is recycled by the recycling unit 160. If developer flows out from the first trench 170, thinner flows from the second trench 180. The flow of developer and thinner is controlled by a diverter 190.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An apparatus for removing photo-resist, comprising:
   a plurality of carriers, to carry a wafer;
   a plurality of hot plates, to remove residue solvent on the wafer;
   a cooling plate, to decrease the wafer temperature;
   a reverse unit, to turn over the wafer;
   a development unit having a wafer processing region, said development unit selectively developing and removing photo-resist on the wafer while the wafer is disposed in the wafer processing region;
   a top scrubbing unit, to clean a top side of the wafer; and
   a back scrubbing unit, to clean a back side of the wafer.

2. The apparatus according to claim 1, wherein the development unit further comprises:
   a first nozzle, to spray thinner on the wafer disposed in the wafer processing region;
   a second nozzle, to spray developer on the wafer disposed in the wafer processing region; and
   a third nozzle, to spray a medium on the wafer disposed in the wafer processing region, the medium causing the thinner to be dissolvable in water, so that the residue solvent on the wafer can be removed.

3. The apparatus according to claim 2, wherein the thinner comprises N-methyl-pyrrolidone.

4. The apparatus according to claim 2, wherein the thinner comprises pyrrolidone with a lower polarity.

5. The apparatus according to claim 2, wherein the thinner comprises pyridin with a lower polarity.

6. The apparatus according to claim 2, wherein the thinner comprises aromatic with a lower polarity.

7. The apparatus according to claim 2, wherein the medium comprises ketone with a higher polarity.

8. The apparatus according to claim 2, wherein the medium comprises alcohol with a higher polarity.

9. The apparatus according to claim 1, wherein the development unit further comprises a recycling unit.

10. The apparatus according to claim 2, wherein the medium comprises acetone.

11. An apparatus for removing photo-resist, comprising:
    a plurality of carriers, to carry a wafer;
    a plurality of hot plates, to remove residue solvent on the wafer;
    a cooling plate, to decrease the wafer temperature;
    a reverse unit, to turn over the wafer;
    a development unit, to develop and remove photo-resist on the wafer, wherein the development unit comprises a wafer processing region, a first nozzle for spraying thinner on the wafer while disposed in the water processing region, a second nozzle for spraying developer on the wafer while disposed in the wafer processing region and a third nozzle for spraying a medium on the wafer while disposed in the wafer processing region;
    a top scrubbing unit, to clean a top side of the wafer; and
    a back scrubbing unit, to clean a back side of the wafer.

12. The apparatus according to claim 11, wherein the thinner comprises N-methyl-pyrrolidone.

13. The apparatus according to claim 11, wherein the thinner comprises pyrrolidone with a lower polarity.

14. The apparatus according to claim 11, wherein the thinner comprises pyridin with a lower polarity.

15. The apparatus according to claim 11, wherein the thinner comprises aromatic with a lower polarity.

16. The apparatus according to claim 11, wherein the medium comprises ketone with a higher polarity.

17. The apparatus according to claim 11, wherein the medium comprises alcohol with a higher polarity.

18. The apparatus according to claim 11, wherein the development unit further comprises a recycling unit.

19. The apparatus according to claim 11, wherein the medium comprises acetone.

* * * * *